United States Patent
Pesonen

(10) Patent No.: US 7,859,838 B2
(45) Date of Patent: Dec. 28, 2010

(54) ARRANGEMENT FOR PLACING A FREQUENCY CONVERTER IN A CABINET

(75) Inventor: Sami Pesonen, Jakkula (FI)

(73) Assignee: Vacon Oyj, Vaasa (FI)

( * ) Notice: Subject to any disclaimer, the term of this patent is extended or adjusted under 35 U.S.C. 154(b) by 950 days.

(21) Appl. No.: 11/641,744

(22) Filed: Dec. 20, 2006

(65) Prior Publication Data
US 2007/0147637 A1   Jun. 28, 2007

(30) Foreign Application Priority Data
Dec. 21, 2005   (FI) ................................ 20051307

(51) Int. Cl.
*H05K 7/20* (2006.01)
(52) U.S. Cl. .................. 361/695; 361/690; 361/716; 454/184
(58) Field of Classification Search .................. None
See application file for complete search history.

(56) References Cited

U.S. PATENT DOCUMENTS

| | | | | |
|---|---|---|---|---|
| 4,691,274 A | * | 9/1987 | Matouk et al. ............... 363/141 |
| 5,173,819 A | * | 12/1992 | Takahashi et al. ......... 360/97.03 |
| 5,743,052 A | * | 4/1998 | Mayhall et al. ............... 52/36.1 |
| 6,185,098 B1 | * | 2/2001 | Benavides ................... 361/695 |
| 6,307,750 B1 | * | 10/2001 | Bendikas et al. ............ 361/725 |
| 6,563,048 B2 | * | 5/2003 | Holt et al. ...................... 174/50 |
| 7,173,821 B2 | * | 2/2007 | Coglitore .................... 361/695 |
| D541,744 S | * | 5/2007 | Virolainen et al. ......... D13/110 |
| 2005/0128722 A1 | | 6/2005 | Miller et al. |
| 2006/0063411 A1 | * | 3/2006 | Kim et al. .................... 439/247 |
| 2006/0120001 A1 | * | 6/2006 | Weber et al. ................. 361/103 |

FOREIGN PATENT DOCUMENTS

EP   1467453 A2   10/2004

* cited by examiner

*Primary Examiner*—Boris L Chervinsky
(74) *Attorney, Agent, or Firm*—Birch, Stewart, Kolasch & Birch, LLP

(57) ABSTRACT

An arrangement and method for placing a frequency converter in a cabinet, wherein the frequency converter is fitted in an instrument cabinet having a frame and walls, wherein the frame (101) of the instrument cabinet is of modular construction, and wherein the frequency converter is integrated in the instrument cabinet to form one or more frequency converter modules, each of which comprises a frame part and electric components in such manner that the electric components of the frequency converter are ready installed in the instrument cabinet frame at least mainly before being brought to the site of utilization.

10 Claims, 6 Drawing Sheets

ARRANGEMENT FOR PLACING A FREQUENCY CONVERTER IN A CABINET

The present invention relates to an arrangement for placing a frequency converter in a cabinet. The invention also relates to a method for installing a frequency converter in an instrument cabinet.

At present, especially high-power frequency converters are placed in instrument cabinets, and often a plurality of such cabinets may be placed side by side. The frequency converter is installed in a completed instrument cabinet, which comprises a cabinet frame, on which the frequency converter and its power unit and control unit are placed, and cabinet walls.

A drawback with a prior-art installation like this is in particular the fact that the installation work has to be carried out at the site of application or at the instrumentation manufacturer's premises, and this involves a relatively complicated installation and inefficient logistics. Moreover, it requires at the installation site a relatively large number of installers well versed in frequency converter technology.

The object of the present invention is to overcome the drawbacks of prior art and to achieve a new type of arrangement for placing a frequency converter in a cabinet. The solution of the invention is based on a concept whereby the frame of the instrument cabinet is of modular construction and the frequency converter is integrated with the instrument cabinet so that it forms together with the instrument cabinet frame a frequency converter module, the components of the frequency converter being ready mounted in instrument cabinet frame modules before the cabinet is brought to the site of utilization, so that no frequency converter components need to be installed inside the cabinet at the site of utilization. In addition, according to the invention, fitted to the lower part of the instrument cabinet is a continuous plinth structure to be fitted under the instrument cabinet modules.

According to a preferred embodiment of the invention, the instrument cabinet comprises a set of horizontal conductor rails fitted in the upper part of the instrument cabinet and consisting of sections equal to the width of each instrument cabinet module. Thus, the conductor rails can also be fitted in the instrument cabinet before the cabinet is brought to the site of utilization.

The features of the present invention are presented in detail in the claims below.

By applying the invention, a frequency converter and its instrument cabinet can be implemented as a modular structure. This makes it possible to accelerate and facilitate the installation of frequency converters especially at site of utilization.

Figure 1A:
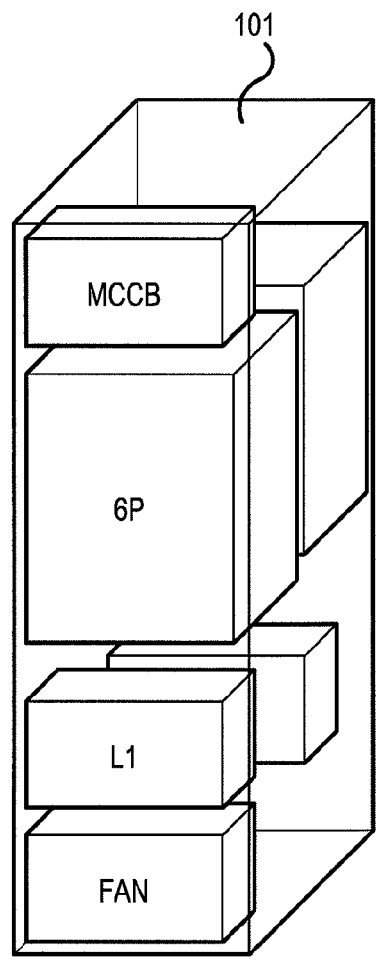
Figure 1B:
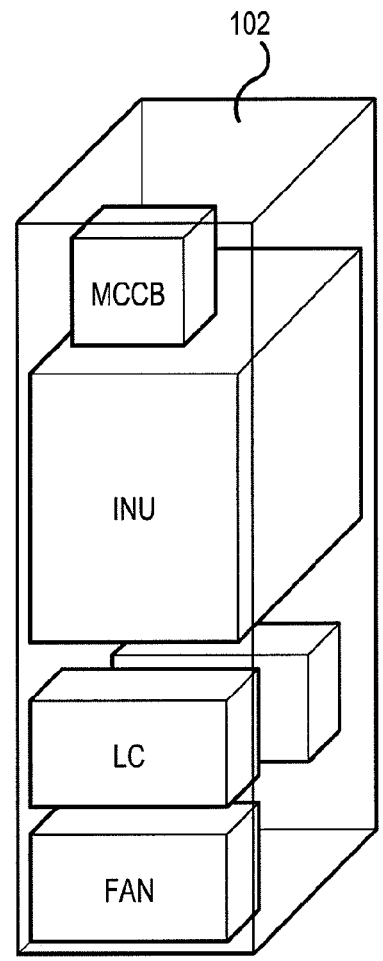
Figure 1C:
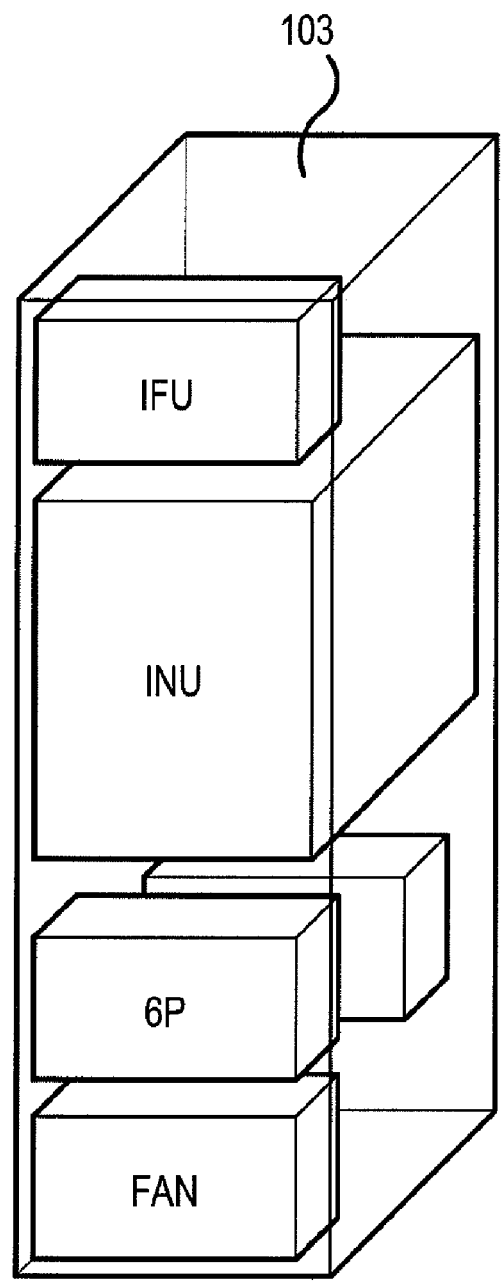
Figure 2:
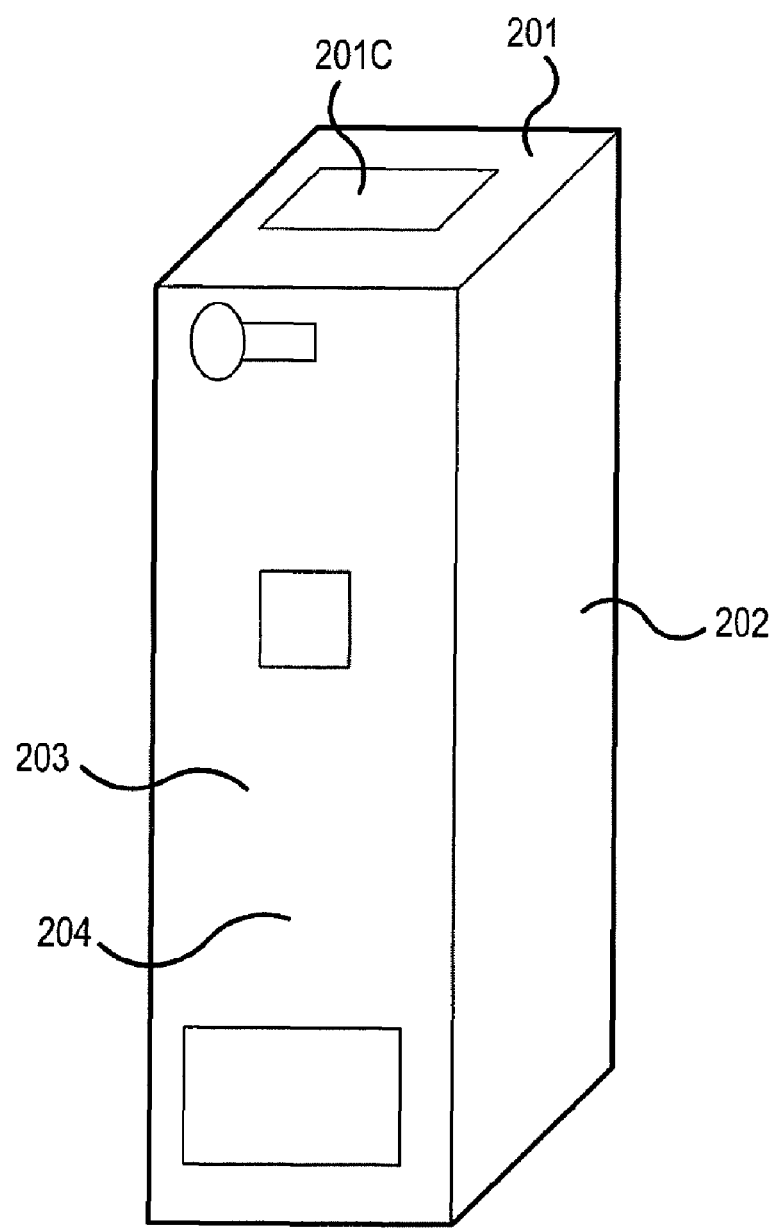
Figure 3:
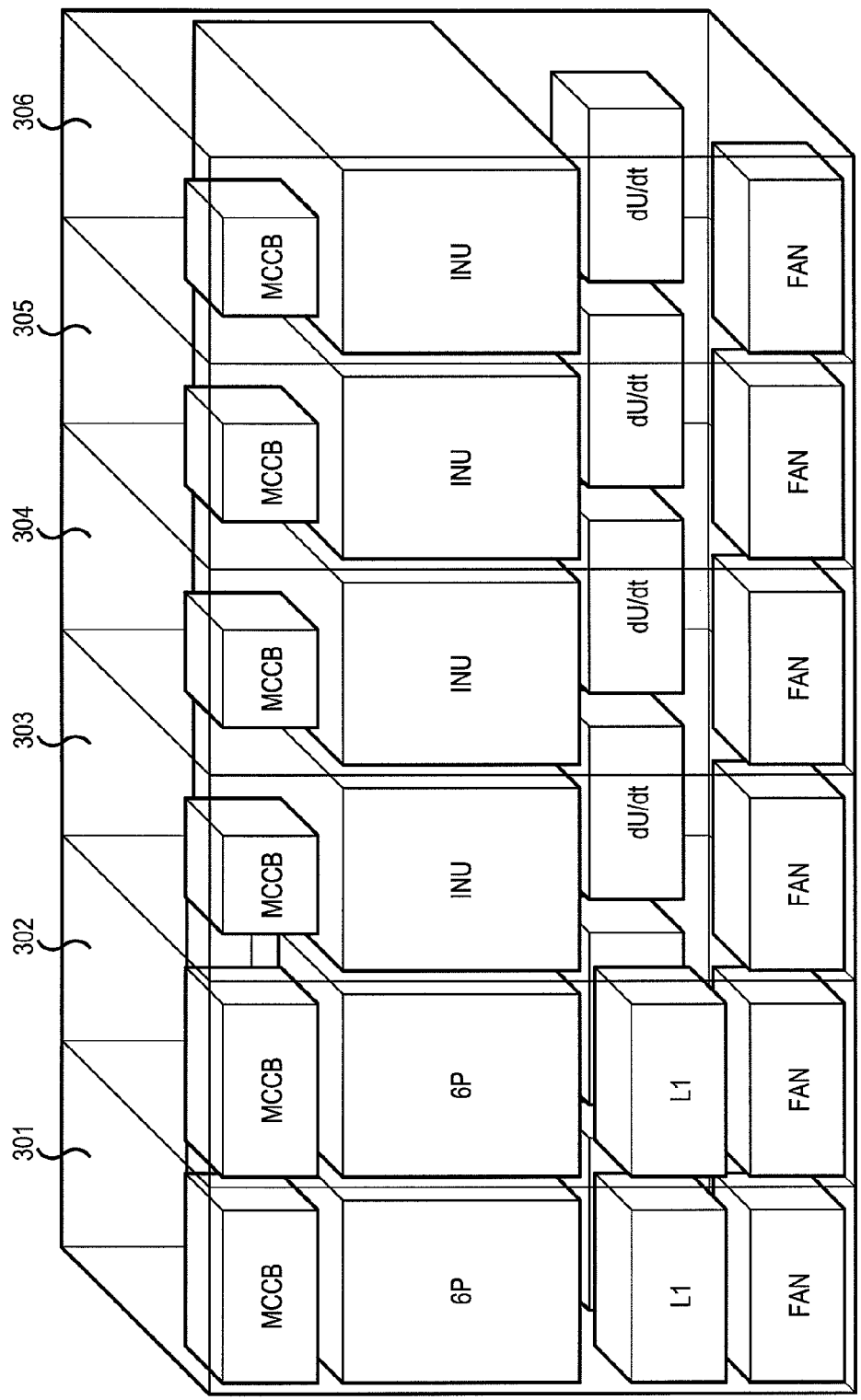
Figure 4:
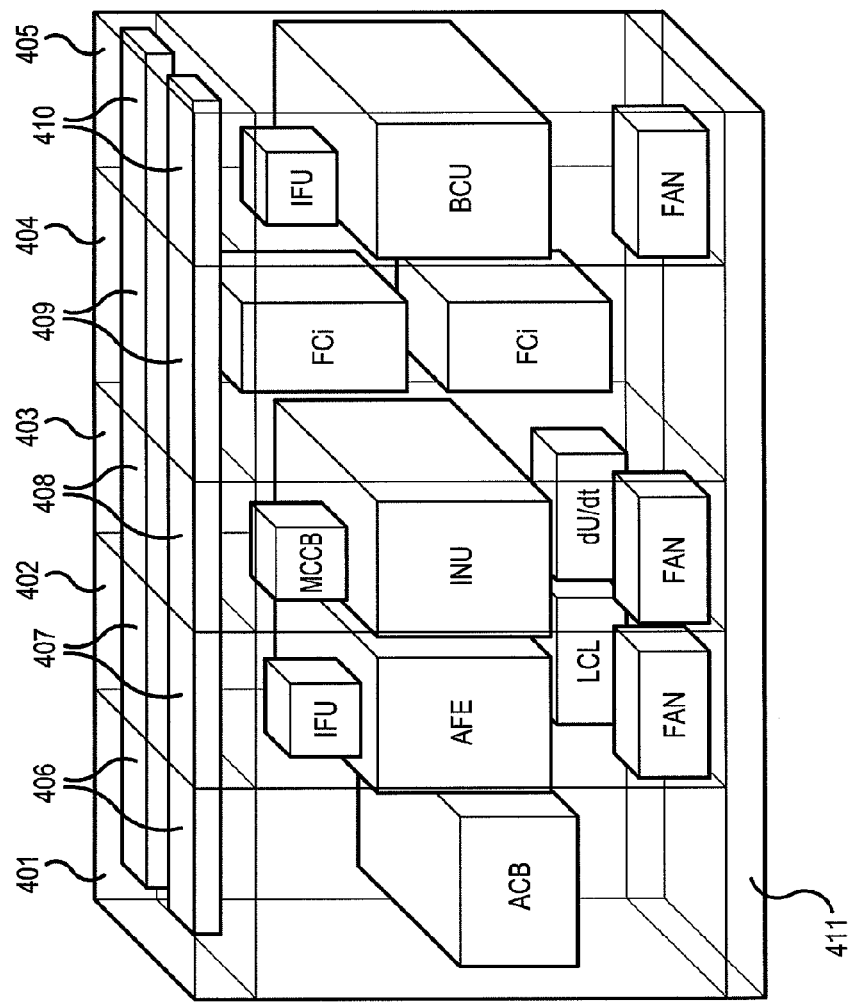
Figure 5:
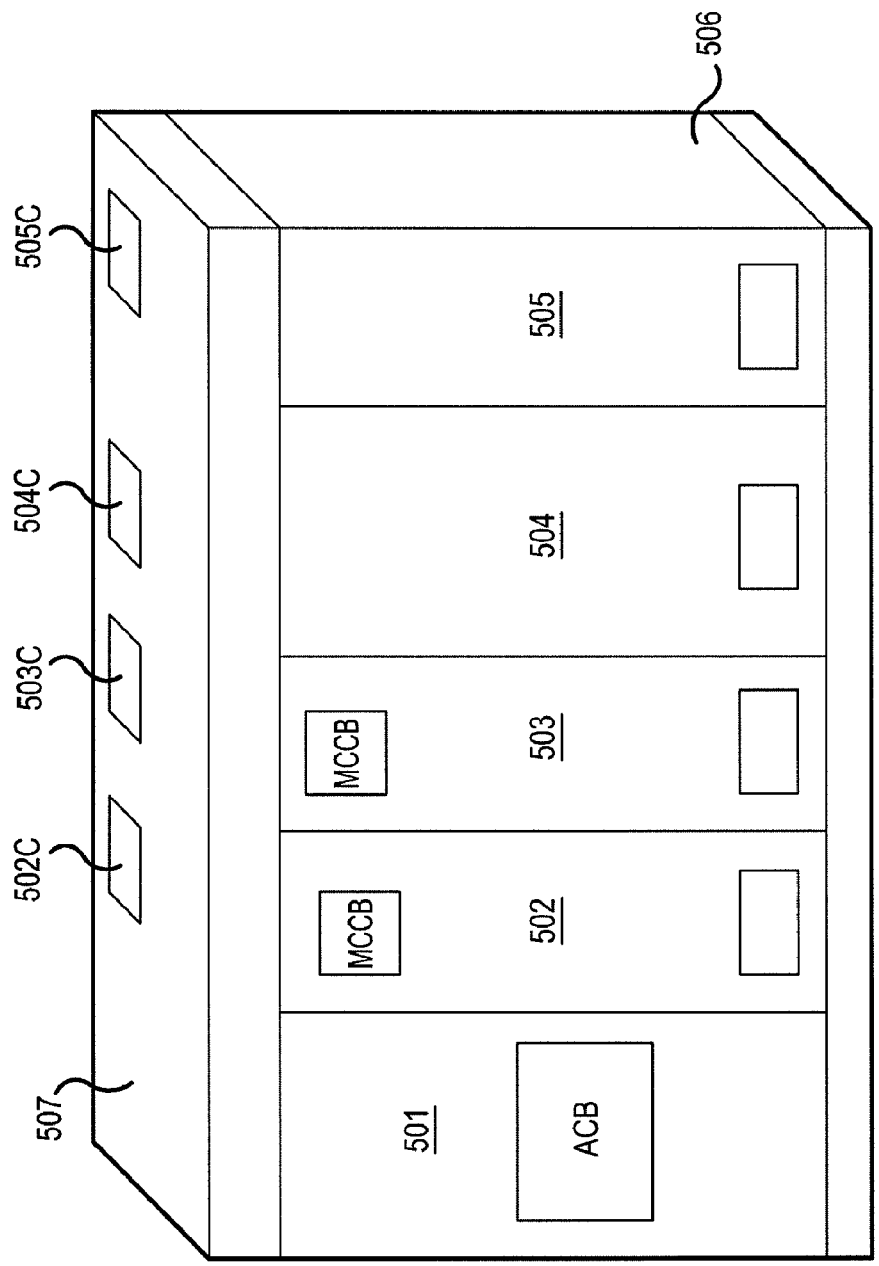

In the following, the invention will be described in detail by referring to an example and the attached drawings, wherein FIGS. 1a, 1b and 1c present instrument cabinet frame modules with frequency converter components fitted in them, FIG. 2 presents a frequency converter cabinet according to FIGS. 1a-1c, containing a frequency converter module according to the invention ready installed, FIG. 3 presents a frequency converter according to the invention comprising six frequency converter modules, FIG. 4 presents a frequency converter according to the invention comprising five frequency converter modules and above them a set of conductor rails arranged above each module, and FIG. 5 presents a frequency converter cabinet according to FIG. 4 ready installed.

FIGS. 1a-1c present instrument cabinet frame modules of a high-power frequency converter to be placed in an instrument cabinet, wherein components of the frequency converter are fitted in skeletal frame modules 101, 102, 103. Fitted one above the other in the frame module in FIG. 1a are a circuit breaker (compact switch) MCCB, a diode bridge, i.e. mains bridge (six-pulse) 6P, an inductor L1 and an air impeller FAN, in FIG. 1b a circuit breaker MCCB, an inverter (load bridge) INU, a mains fuse LCL and an air impeller FAN, and in FIG. 1c input fuses IFU, an inverter INU, a diode bridge 6P and an air impeller FAN. The frame 101-103 of the instrument cabinet is of modular construction, i.e. it consists of separate parts mounted side by side, and the frequency converter is integrated in the instrument cabinet, consisting of frequency converter modules so that each frequency converter component mentioned above is ready installed in an instrument cabinet frame module before the cabinet is brought to the site of utilization.

FIG. 2 presents a complete frequency converter, which has side, bottom and top walls 201-203, a user interface 204 in the front side and a module frame according to FIG. 1c with frequency converter components fitted inside it.

FIG. 3 presents a frequency converter comprising six adjacently mounted frame modules 301-306 of equal width. Fitted one above the other in the two modules to the left are circuit breaker MCCB, a diode bridge 6P, and inductor L1 and an air impeller FAN, and in the four modules to the right a circuit breaker MCCB, an inverter INU, a voltage increase rate filter dU/dt and an air impeller FAN.

In FIG. 4, the frequency converter comprises five cabinet frame modules 401-405. The first module to the left contains a circuit breaker (air circuit breaker) ACB, the next module contains input fuses IFU, a regenerative feed unit AFE and an air impeller FAN, the next one contains a circuit breaker MCCB, an inverter INU, a voltage increase rate filter dU/dt and an air impeller FAN, the next one contains two frequency converters with intermediate circuit connectors FCi, placed one above the other, and the module to the right contains input fuses IFU, a braking chopper BCU and an air impeller FAN. The ACB and FCi modules are somewhat wider than the others, which again are mutually equal in width. In addition, fitted in the upper part of the cabinet is a set of horizontal conductor rails, likewise of modular construction, consisting of rail sections 406-410 of a length corresponding to the width of each module. Moreover, placed under the whole frequency converter is a continuous plinth 411. FIG. 5 presents the frequency converter of FIG. 4 ready encased so that it has front doors 501-505, side walls 506 and continuous plinth and a continuous top part 507.

To install a frequency converter, the required electric components of the frequency converter are pre-installed at factory in frame modules, of which a required number is provided, depending on the power requirement etc. At the site of utilization, the frequency converter modules are then mounted on a plinth, whereupon the "casing", i.e. the side walls, doors and top are mounted in place. After this, the frequency converter is ready to be electrically connected to make it operational.

The frequency converter modules are provided with a cooling fan, which blows cooling air especially through the apparatus in a horizontal direction or upwards through an additional channel. These additional channels, through which air is blown upwards, are illustrated as additional channel 201C in FIG. 2, and additional channels 502C, 503C, 504C, and 505C in FIG. 5.

It is obvious to a person skilled in the art that different embodiments of the invention are not exclusively limited to the embodiment example described above, but that they may be varied within the scope of the claims presented below.

The invention claimed is:

1. An arrangement for housing one or more frequency converter modules of a frequency converter in an instrument cabinet, the arrangement comprising:
   a plurality of instrument cabinet frame modules arranged side by side, each having a top, a bottom, and a front, a back, and two vertical sides;
   wherein each of the instrument cabinet frame modules is adapted to house one of the frequency converters, each of the frequency converters comprising at least a cooling fan, a frame part, and electric components, the cooling fan being arranged at the bottom of the instrument cabinet frame module, and the electrical components being arranged above the cooling fan.

2. The arrangement according to claim 1 further comprising a continuous plinth structure extending under the bottoms of the plurality of instrument cabinet frame modules arranged side by side.

3. The arrangement according to claim 1, further comprising a set of horizontal conductor rails fitted along an upper part of the instrument cabinet frame modules arranged side by side,
   wherein each of the rails includes a plurality of sections, each of which has a length equal to a width of the corresponding instrument cabinet frame module.

4. The arrangement according to claim 1, wherein the instrument cabinet frame modules arranged side by side are of equal width.

5. The arrangement according to claim 1, wherein some of the instrument cabinet frame modules are of different width.

6. The arrangement according to claim 1, the cooling fan blows cooling air through the instrument cabinet frame modules in a horizontal direction or upwards through an additional channel.

7. The arrangement according to claim 1, wherein the electrical components in each of the frequency converters include one or more of a main fuse, an inverter, and a circuit breaker installed above the cooling fan.

8. The arrangement according to claim 1, wherein the plurality of instrument cabinet frame modules are mounted on a plinth which has a length substantially equal to a combined width of the instrument cabinet frame modules arranged side by side.

9. A method for housing one or more frequency converter modules of a frequency converter in an instrument cabinet having a frame and, the instrument cabinet comprising a plurality of instrument cabinet frame modules arranged side by side, each having a top, a bottom, a front, a back, and two vertical sides, wherein each of the instrument cabinet frame modules is adapted to house one of the frequency converters, each of the frequency converters comprising at least a cooling fan, and electric components,
   placing the cooling fan at the bottom of each of the instrument cabinet frame modules, and
   placing and the electrical components above the cooling fan, so that the cooling fan and the electric components of the frequency converter are installed in the corresponding instrument cabinet frame module before the instrument cabinet frame modules are brought to a site of utilization.

10. The method according to claim 9, further comprising the step of:
   mounting each of the instrument cabinet modules on a plinth at the site of utilization, whereupon and then
   mounting at least the top and a door onto each of the instrument cabinet frame modules.

* * * * *